(12) United States Patent
Douma

(10) Patent No.: US 8,693,879 B2
(45) Date of Patent: Apr. 8, 2014

(54) DISCRETE BOOTSTRAPPING IN AN OPTICAL RECEIVER TO PREVENT SIGNAL FEEDBACK

(75) Inventor: Darin James Douma, Monrovia, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 13/296,137

(22) Filed: Nov. 14, 2011

(65) Prior Publication Data

US 2012/0057879 A1    Mar. 8, 2012

Related U.S. Application Data

(63) Continuation of application No. 11/676,474, filed on Feb. 19, 2007, now Pat. No. 8,059,973.

(60) Provisional application No. 60/774,787, filed on Feb. 17, 2006.

(51) Int. Cl.
*G01J 1/44* (2006.01)
*H04B 10/06* (2011.01)
*H04B 10/00* (2013.01)

(52) U.S. Cl.
USPC ........ 398/135; 398/202; 250/214 A; 257/508; 257/773; 257/532

(58) Field of Classification Search
USPC .................................................. 398/135, 202
See application file for complete search history.

(56) References Cited

U.S. PATENT DOCUMENTS

| | | | |
|---|---|---|---|
| 2001/0005039 A1* | 6/2001 | Russell | 257/666 |
| 2002/0134919 A1* | 9/2002 | Washburn et al. | 250/214 A |
| 2003/0222698 A1* | 12/2003 | Khieu et al. | 327/328 |
| 2004/0190835 A1* | 9/2004 | Burdick et al. | 385/89 |
| 2005/0062540 A1* | 3/2005 | Nakatani et al. | 330/294 |
| 2006/0049338 A1* | 3/2006 | Sherazi et al. | 250/214 R |
| 2006/0140554 A1* | 6/2006 | Oki | 385/92 |

FOREIGN PATENT DOCUMENTS

| | | |
|---|---|---|
| JP | 2008-55534 | 7/2011 |
| JP | 2008-55534 | 8/2012 |

* cited by examiner

*Primary Examiner* — Oommen Jacob
(74) *Attorney, Agent, or Firm* — Maschoff Brennan

(57) ABSTRACT

An optical receiver assembly that is configured to avoid the introduction of feedback in an electrical signal converted by the assembly is disclosed. In one embodiment, an optical receiver assembly is disclosed, comprising a capacitor, an optical detector provided with a power supply being mounted on a top electrode of the capacitor, and an amplifier mounted on the reference surface. The assembly further includes an isolator interposed between the reference surface and the capacitor, wherein the isolator includes a bottom layer of dielectric material that is affixed to a portion of the reference surface, and a metallic top plate that is electrically coupled both to a ground of the amplifier and to the capacitor. This configuration bootstraps the amplifier ground to the amplifier input via the photodiode top electrode of the capacitor to cancel out feedback signals present at the amplifier ground.

20 Claims, 3 Drawing Sheets

DISCRETE BOOTSTRAPPING IN AN OPTICAL RECEIVER TO PREVENT SIGNAL FEEDBACK

CROSS-REFERENCE TO RELATED APPLICATIONS

This application is a continuation of, and claims priority to, U.S. patent application Ser. No. 11/676,474, filed Feb. 19, 2007, which claims the benefit of the U.S. Provisional Patent Application No. 60/774,787, filed Feb. 17, 2006, and entitled "DISCRETE BOOTSTRAPPING IN AN OPTICAL RECEIVER TO PREVENT SIGNAL FEEDBACK," each of which is incorporated herein by reference in its entirety.

BACKGROUND

1. Technology Field

The present invention generally relates to receivers used to detect optical signals in an optical communications network. In particular, the present invention relates to a discrete bootstrapping configuration for an optical receiver that reduces the incidence of feedback of a signal received by the optical receiver.

2. The Related Technology

Fiber-optics and optoelectronics are important aspects of modern optical networks because they allow for efficient, accurate and rapid transmission of optical data between various components in the network system. An optical transceiver module ("transceiver") is an example of a modular component that is used in optical networks. Such modular components are desirable in optical networks and other fiber optic systems to reduce the cost of manufacturing the system, which cost increases the more customized the system becomes.

Transceivers usually include an input receiver optical subassembly ("ROSA") and an output transmitter optical subassembly ("TOSA"). The ROSA includes a photodiode or other optical detector for detecting optical signals and sensing circuitry for converting the optical signals to electrical signals compatible with other network components. The TOSA includes a laser or other suitable light source for transmitting optical signals and may include control circuitry for modulating the laser according to an input digital data signal and a photodetector to monitor laser power.

The TOSA has an optical lens for focusing the optical signals from the laser of the TOSA into an optical fiber. Similarly, the ROSA often includes a lens to focus incoming optical signals on the photodiode. Additionally, one end of the transceiver includes pluggable receptacles, pig-tailed connections, or other suitable means for optically connecting the TOSA and the ROSA with other components within a fiber optic network, while an opposite end of the transceiver includes a connector for connecting with electrical components of a host system or device with which the transceiver communicates.

The photodiode in the ROSA and the laser in the TOSA are examples of optoelectronic semiconductor components. Generally, these optoelectronic semiconductor components are sensitive devices that require mechanical and environmental protection. As such, these optoelectronic components are usually manufactured in packages to provide such protection and to facilitate their incorporation into higher level devices, such as TOSAs and ROSAs.

One such packaging assembly is known as a transistor-outline package, referred to herein as a "TO package." TO packages are widely used in the field of optoelectronics, and may be employed in a variety of applications. As such, TO packages are often standardized to facilitate their incorporation into components such as transceivers. The TO packages protect the sensitive electrical devices contained therein and electrically connect such devices to external components such as printed circuit boards ("PCB").

With respect to their construction, the TO packages often include a cylindrical metallic base, also known as a header, with a number of conductive leads extending completely through, and generally perpendicular to, the base. The size of the base is often sized to fit within a specific TO standard size and lead configuration, examples of which include a TO-5 or TO-46. The leads are usually hermetically sealed in the base to provide mechanical and environmental protection for the components contained in the TO package, and to electrically isolate the conductive leads from the metallic material of the base. Typically, one of the conductive leads is a ground lead that may be electrically connected directly to the base.

Various types of electrical devices and optical components, such as the photodiode or laser device, are mounted on an interior portion of the base and connected to the leads to enable their operation. Generally a cap, also known as a can, is used to enclose the interior portion of the base where such electrical devices are mounted so as to form a hermetic chamber that helps prevent contamination or damage to the devices. The specific design of the TO package depends on the optoelectronic component being mounted on the base and the modular component with which the TO package will be used. By way of example, in applications where the optoelectronic component mounted on the base is an optical component, i.e., a laser or photodiode, the cap is at least partially transparent so as to allow an optical signal generated or received by the optical component to be transmitted to or from the TO package. These optical TO can packages are also known as window cans.

As stated above, optical receivers are specifically built for the purpose of receiving and interpreting light signals. An optical receiver typically includes some sort of detector that can generate an electrical current or voltage in response to changes in the power of the incident optical signal. After the fiber optic receiver converts the optical signal received over the optical fiber into an electrical signal, the optical receiver amplifies the electrical signal, and converts the electrical signal into an electrical digital data stream.

One of the common devices used as a detector in an optical receiver is a photodiode. A photodiode operates by generating a current in response to incident light. The optical power of the incident light determines the current that flows in the photodiode. In effect, the optical signal generates current in the photodiode that corresponds to the digital data carried by the optical fiber.

Despite their utility, packages such as TO packages that house photodiodes or other optical detectors can suffer from performance-related challenges. One of these challenges is signal feedback. In the case of optical receiver packages, feedback is a result of amplification of the electrical signal converted from an optical signal received by the photodiode, as explained above. This amplification is performed by a signal amplifier, such as a transimpedance amplifier, and the amplification of the output signal produced by the amplifier can be significant when compared to the original strength of the converted photodiode signal, which can result in a certain amount of feedback. Moreover, the signals converted by the photodiode are often high frequency signals of 10 GHz or more, which can further exacerbate feedback.

Thus, significant signal amplification, together with the high frequency of the amplified signal, combine to create a signal that is apt to produce feedback in the system in which the photodiode and amplifier are found. This feedback is manifested as a portion of the signal from the amplifier ground that migrates back to the amplifier input via various structures, including the header surface, power supply and ground connections, bond wires, etc. Such feedback is unintended and can represent a significant limitation in terms of performance of the package, e.g., frequency response. Should the feedback exceed minimal levels, oscillation can occur, which undesirably destroys any functionality of the package and requires scrapping of the part.

In light of the above, a need exists for controlling feedback in an optical receiver system, such as an optoelectronic package housing a photodiode, in order to optimize operation of the device. Any solution should be implemented in a manner that does not substantially increase the sophistication or complexity of the device and that does not compromise signal integrity.

BRIEF SUMMARY

The present invention has been developed in response to the above and other needs in the art. Briefly summarized, embodiments of the present invention are directed to an optical receiver assembly that is configured to avoid the introduction of feedback in an electrical signal converted by the assembly. In one embodiment, an optical receiver assembly is disclosed, comprising a capacitor, an optical detector provided with a power supply being mounted on the capacitor, and an amplifier mounted on a top electrode of the reference surface. The assembly further includes an isolator interposed between the reference surface and the capacitor. The isolator includes a bottom layer of dielectric material that is affixed to a portion of the reference surface and a metallic top plate that is electrically coupled both to a ground of the amplifier and to the capacitor. This configuration "bootstraps" the amplifier ground to the amplifier input via the photodiode and top electrode of the capacitor, and by so doing, allows feedback signals present at the amplifier ground to be transmitted to the amplifier input via the photodiode, which desirably cancels the feedback signal in the circuit.

Configuration of the optical receiver assembly as described above in one embodiment further reduces parasitic capacitance and inductance that may otherwise be present in the circuits of the assembly.

The optical receiver assembly in one embodiment forms part of an optoelectronic package housed in an optical subassembly for use within an optical transceiver module, for instance. As such, the optical receiver can form an integral part of an optical communications network.

These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof that are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF SELECTED EMBODIMENTS

Reference will now be made to figures wherein like structures will be provided with like reference designations. It is understood that the drawings are diagrammatic and schematic representations of exemplary embodiments of the invention, and are not limiting of the present invention nor are they necessarily drawn to scale.

FIGS. 1-5 depict various features of embodiments of the present invention, which is generally directed to an optical receiver assembly that is configured to avoid the introduction of feedback in an electrical signal converted by the assembly. Reduction or elimination of signal feedback in the optical receiver assembly enables optimization of the assembly and assurance of acceptable signal integrity for its use within a communications network, for example. Embodiments of the optical receiver assembly can be included in optoelectronic packages, including TO packages that form a component of an optical subassembly for an optical transceiver module. Such modules are central to the interfacing of electronic devices, such as computers, routers and the like, with an optical communications network employing fiber optic technology. In addition, the feedback-reducing optical receiver assembly can also be employed in other operating environments if desired.

As mentioned, an exemplary embodiment of the optical receiver assembly described herein is embodied within an optoelectronic package of a receiver optical subassembly ("ROSA") for an optical transceiver module ("transceiver"). The ROSA, together with a transmitter optical subassembly ("TOSA") of the transceiver, includes various components to enable the reception and transmission of optical signals to and from a host system that is operably connected to the transceiver. The host system can be included as a node in an optical communications network, for instance, and can employ the transceiver in communicating via optical signals with other components of the network. Note, however, that the discussion to follow regarding embodiments of the present invention as they relate to controlling feedback in relation to an optical receiver should not be construed as limiting the present invention to only such embodiments. Indeed, it is appreciated that principles of the present invention can extend to optical receivers employed in other configurations as well.

Figure 1:
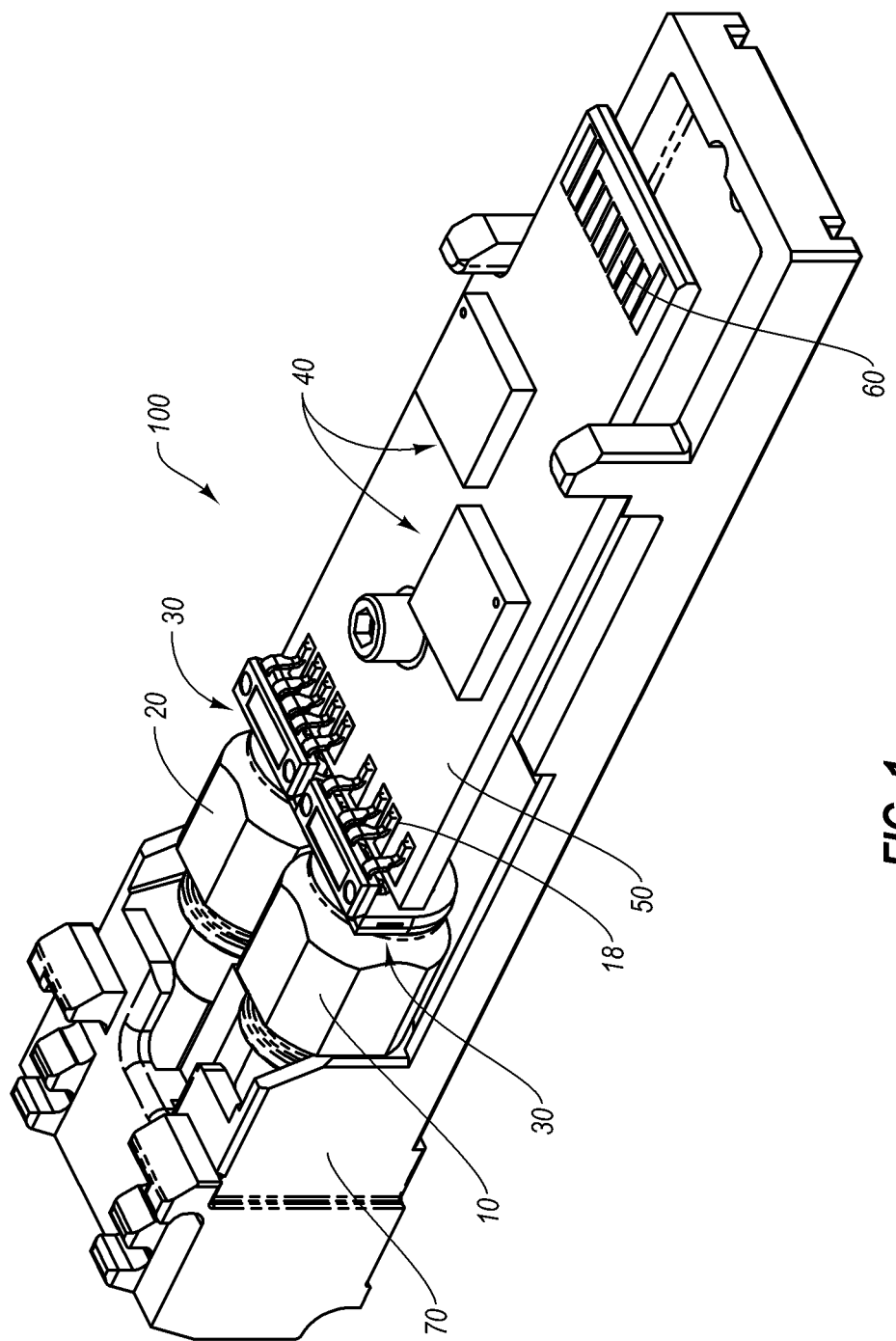
FIG. 1 is a perspective view of an optical transceiver module which serves as one exemplary environment in which embodiments of the present invention can be practiced.

Reference is first made to FIG. 1, which depicts a perspective view of an optical transceiver module ("transceiver"), generally designated at 100, for use in transmitting and receiving optical signals in connection with an external host that is operatively connected in one embodiment to a communications network (not shown). As depicted, the transceiver shown in FIG. 1 includes various components, including an optical receiver implemented as a receiver optical subassembly ("ROSA") 20, a transmitter optical subassembly ("TOSA") 10, electrical interfaces 30, various electronic components 40, and a printed circuit board 50. In detail, two electrical interfaces 30 are included in the transceiver 100, one each used to electrically connect the ROSA 20 and the TOSA 10 to a plurality of conductive pads located on the PCB 50. The electronic components 40 are also operably attached to the PCB 50. An edge connector 60 is located on an end of the PCB 50 to enable the transceiver 100 to electrically interface with a host (not shown here). As such, the PCB 50 facilitates electrical communication between the TOSA 10/ROSA 20, and the host. In addition, the above-mentioned components of the transceiver 100 are partially housed within a housing portion 70. Though not shown, a shell can cooperate with the housing portion 70 to define a covering for the components of the transceiver 100.

Figure 2:
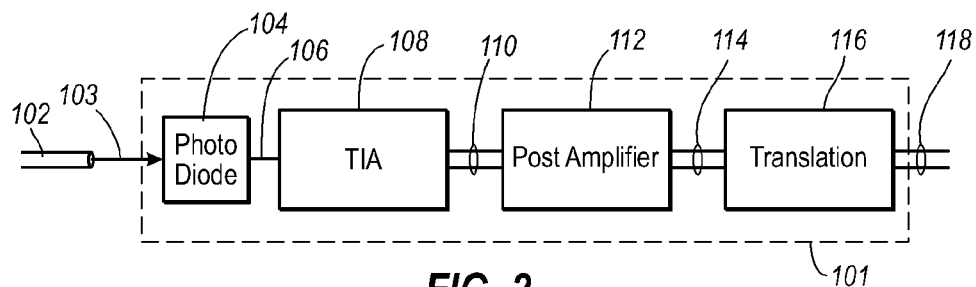
FIG. 2 is a simplified block diagram of an optical receiver that can include a photodiode to TIA interface configured in accordance with one embodiment of the present invention.

FIG. 2 illustrates further details regarding the exemplary environment of FIG. 1 for implementing embodiments of the present invention. In detail, FIG. 1 illustrates in block form a fiber optic receiver 101 that includes components that are found in the ROSA 20 and electronic components 40 of the PCB 50 shown in FIG. 1. The receiver 101 receives a data-containing optical signal ("light") 103 over an optical fiber 102. A photodiode 104 or other optical device for converting an optical signal receives the optical signal and converts it into an electrical signal 106, manifested as an electrical current. A transimpedance amplifier ("TIA") 108 amplifies the electrical signal 106 to produce the amplified electrical signal 110. The TIA 108 has a wide dynamic range that is able to amplify signals with large power without significantly diminishing the ability to amplify signals with low power. The amplified electrical signal 110 is then amplified by a post amplifier 112 or is operated on by another integrated circuit such as a clock and data recovery circuit. The output 114 of the post amplifier 114 is interpreted or translated by the translation module 116 and converted into an electrical digital signal 118. The digital signal 118 can then be forward to a host via other components of the transceiver for use by the host.

Figure 3:
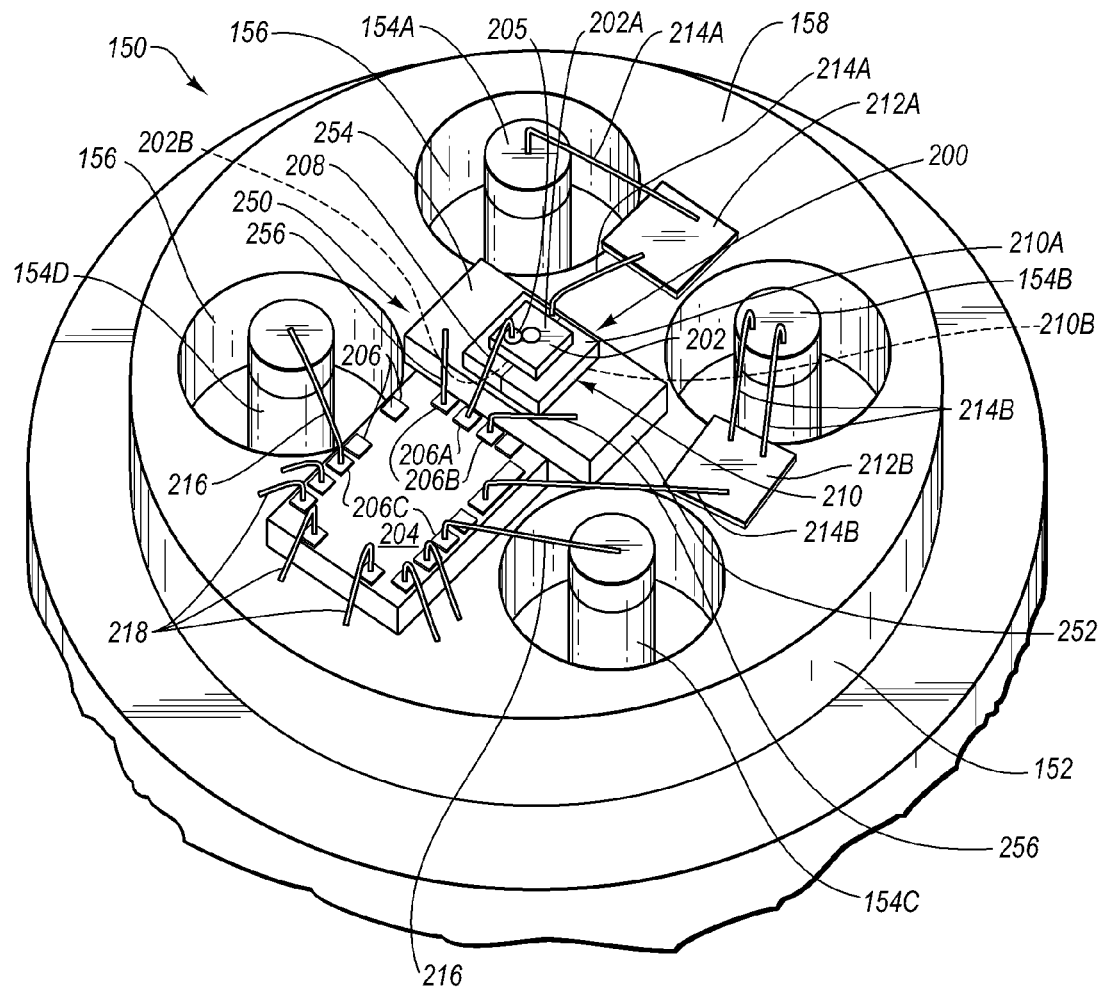
FIG. 3 is a perspective view of a base portion of an optoelectronic package, including an optical receiver assembly in accordance with one embodiment.

Reference is now made to FIG. 3 in describing details regarding an exemplary embodiment of the present invention. In particular, FIG. 3 shows portions of an optical receiver package, generally designated at 150. The package 150 is a TO package and includes a base 152 that is configured to mate with a cap (not shown) in order to form a hermetic environment in which other components of the package 150 can reside. Various leads 154A-D extend through glass seals 156 of the base in order to provide electrical communication between package components and devices positioned exterior to the package 150. The glass seals both environmentally and electrically isolate the leads 154A-D as to prevent electrical shorting or contamination of the hermetic package environment. A reference surface 158 is included on the base and serves as a platform for mounting various package components. When the cap is installed on the base 152 the reference surface 158 and any components mounted thereon are included within the hermetic environment of the package 150. The base 152 is composed of a metallic substance and is grounded via a lead (not shown) such that the reference surface serves as a ground plane for various of the components of the package 150.

The package 150 further includes an optical receiver assembly, generally designated at 200, which is configured in accordance with one embodiment of the present invention. The assembly 200 generally includes an optical detector, such as a photodiode ("PD") 202, and a signal amplifier, such as a transimpedance amplifier ("TIA") 204. The PD 202 in one embodiment is an avalanche photodiode and is positioned in the package 150 to receive incident light from an optical fiber in the manner generally depicted in FIG. 2 and to convert the light into an electrical signal. The TIA 204 is operably connected to the PD 202 in order to receive the electrical signal produced by the PD and amplify the signal prior to forwarding it to other transceiver components, as shown in FIG. 2.

In particular, the TIA 204 includes various bond pads 206 to allow interconnection of the TIA with various other package components. One of the bond pads 206A is employed to electrically connect with a corresponding bond pad on a top surface 202A of the PD 202 via a bond wire 208. In addition to this configuration, other alternative configurations can be employed to electrically connect the PD 202 and TIA 204 together.

A capacitor 210 is included in the package 150 to reduce the injection of noise into the electrical signal produced by the PD 202. As shown in FIG. 3, the PD 202 is affixed to a surface of the capacitor 210. As such, a bottom electrode 202B of the PD 202 is electrically coupled to top electrode 210A that defines the top surface of the capacitor 210, thereby electrically coupling the PD and capacitor together. A bottom surface of the capacitor 210 defines a bottom electrode 210B of the capacitor 210, which electrode is electrically coupled to a top plate 254 of the isolator 250. In the present embodiment, the capacitor 210 is a single layer capacitor, though in other embodiments other suitable capacitor types could be employed.

Electrical power supplies are provided to both the PD 202 and the TIA 204 in order to enable their functionality. Specifically, the lead 154A provides a power supply both to the PD 202 and the electrode 210A of capacitor 212A, which capacitor is positioned on the reference surface 158 of the base 152, via bond wires 214A. The second electrode of the capacitor being upon its lower surface which is in contact with reference surface 158 and which is electrically coupled to reference surface 158. Specifically, one of the bond wires 214A is attached to and extends between a capacitor 212A and the top electrode 210A of the capacitor 210 on which the PD 202 is positioned. In this way, a power supply signal is provided both to the bottom electrode 202B of the PD 202 and the top electrode 210A of the capacitor 210 via the bond wires 214A. In addition, the capacitor 212A is also powered by the bond wire 214A extending from the lead 154A, together with connection of a bottom electrode of the capacitor 212A with the reference surface 158.

Similarly, the lead 154B provides a power supply to the TIA 204 via bond wires 214B and a top portion of an interposed capacitor 212B positioned on the reference surface 158. Specifically, one of the bond wires 214B is attached to and extends between a top electrode of the capacitor 212B and one of the bond pads 206 of the TIA 204, while two additional bond wires 214B extend between the capacitor top surface and the lead 154B. A bottom electrode of the capacitor 212B included on a bottom surface of the capacitor is electrically coupled to the reference surface 158. In this way, a power supply signal is provided the TIA 204 via the bond wires 214B and the top electrode of the capacitor 212B. Note that the capacitor 212A is used in the present embodiment as described above such that any time-varying voltage present on its top electrode is pasted through the electrode to the reference surface 158.

As already mentioned, the PD 202 provides an electrical signal representative of an optical signal received thereby, and forwards the electrical signal to the TIA 204 for amplification. Once amplified, the electrical signal is forwarded to the package leads 154C and 154D via respective bond wires 216 as a differential signal. The leads 154C and 154D are configured to convey the differential electrical signals to other components of the transceiver, such as the post amplifier 112, shown in FIG. 2, for further processing before being forwarded to a host or other suitable destination. Note that the TIA 204 further includes a plurality of bond wires 218 that each extend from various of the bond pads 206 to the reference surface 158 in order to provide a ground path for portions of the TIA.

In accordance with one embodiment, the optical receiver assembly 200 of the package 150 further includes an isolator 250 on which the capacitor 210 is affixed. The isolator 250 is in turn affixed to the reference surface 158 of the package base 152. In detail, the isolator 250 includes a bottom layer 252 composed of a low dielectric material—having a dielectric constant of less than 10 in one embodiment—and having suitable outgassing properties, i.e., the material will not release gases during operation that may interfere with operation of the optical receiver. The isolator 250 further includes a top plate 254 mated with the bottom layer and composed of a conductive material, such as any suitable metal. Indeed, in one embodiment, the bottom layer 252 is composed of aluminum oxide, i.e., alumina, while the top plate 254 is gold. Alternative materials from which the isolator bottom layer can be composed include fused silica and aluminum nitride. Variations in the composition of the isolator components are possible, however, in accordance with the requirements set forth herein.

In greater detail, the bottom layer 252 of the isolator 250 is affixed to the reference surface 158 of the package base 152. In turn, the bottom electrode 210B of the capacitor 210 is affixed to the top plate 254 of the isolator, and the bottom electrode 202B of the PD 202 is affixed to the capacitor. In addition, bond wires 256 extend from ground bond pads 206B of the TIA 204 to the top plate 254, thereby electrically coupling the TIA ground to the isolator top plate, which in turn couples the TIA ground to the PD power supply that couples to the capacitor 210. As will be seen, this isolator configuration effectively cancels out feedback that may be present in the optical receiver assembly 200.

Note that the bond wires 256 extend between the TIA 204 and the isolator 250 in non-parallel directions. This helps prevent mutual coupling between the bond wires 256, which in turn reduces undesired circuit inductance.

Figure 4:
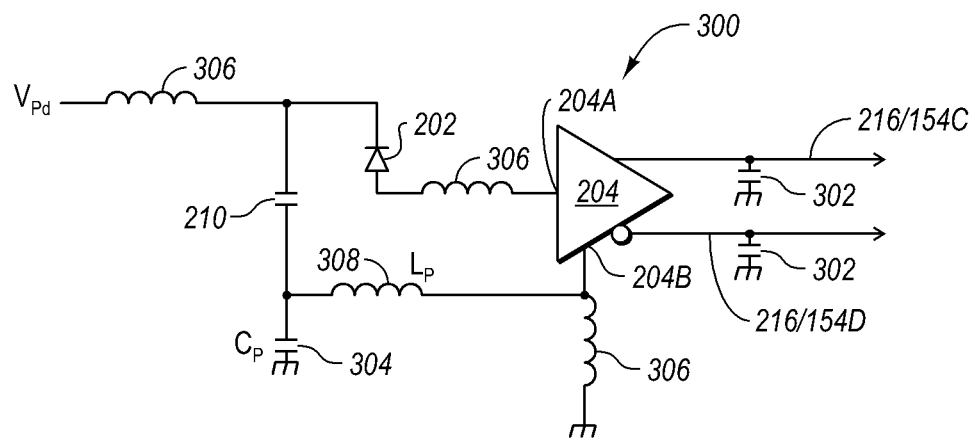
FIG. 4 is a schematic diagram showing various electrical aspects of the optical receiver assembly shown in FIG. 3.

Reference is now made to FIG. 4, which includes a circuit diagram 300 depicting various components and characteristics of the optical receiver assembly and package configured as depicted in FIG. 3. As shown, the PD 202, TIA 204, and capacitor 210 are depicted in electrical relation to one another. The TIA 204 includes a signal input indicated at 204A, corresponding to the TIA bond pad 206 in FIG. 3, and a ground indicated at 204B, which corresponds to the TIA bond pads 206B. A power supply, $V_{pd}$, is shown connected to the PD 202. Residual capacitances, which represent artifacts of the configuration of the optical receiver assembly, are depicted at 302 in relation to the differential electrical signals that are emitted by the TIA 204 and transmitted via the bond wires 216 and leads 154C and 154D (see FIG. 4). A parasitic capacitance 304 is also shown. The capacitances 302 and 304 represent leakage capacitances that are present in the system, i.e., unintended capacitances occurring between the reference surface 158 of the package base 152 and components of the optical receiver assembly 200 shown in FIG. 3.

Various unintended inductances 306 are shown in FIG. 4, which each represent inherent inductances existing in the various bond wires present in the optical receiver assembly 200 of FIG. 3. Also shown is a parasitic inductance 308 that exists between the PD 202 and the TIA 204. In order to minimize feedback and optimize performance of the optical receiver assembly 200 in light of embodiments of the present invention, it is desired to minimize the prevalence of the parasitic capacitance 304 and inductance 308.

With continuing reference to FIGS. 3 and 4, embodiments of the present invention feature the ability to control the presence of feedback in the electrical signal produced and processed by the optical receiver assembly 200 depicted in FIG. 3. During operation of the optical receiver assembly 200, extraneous signals related to the amplified electrical signal produced and output via the bond pads 206C of the TIA 204 for transmission via the leads 154C and 154D can be undesirably communicated through various paths in the package 150 or its components to the TIA input, defined here as the voltage present at bond pad 206A of the TIA relative to the TIA ground. The paths and components by which these extraneous signals can travel include grounds paths internal to the TIA 204, the reference surface 158 of the package base 152, the power supply capacitors 212A and 212B, etc.

This extraneous signal pollution is caused in part by system geometry and the high frequency and amplified strength of the TIA signal. The introduction of this extraneous signal in the above manner results in a net signal being present at the TIA input at bond pad 206A relative to the TIA internal ground, i.e., a feedback signal. As has been discussed, such feedback can inhibit operation of the optical receiver assembly and hinder the desired electrical signal it produces.

In greater detail, the TIA ground itself provides an efficient path for transferring a feedback signal from the TIA outputs at TIA bond pads 206C back to the TIA input at bond pad 206A due to the high conductivity, short length, and low path inductance of the TIA ground. Any imbalance in the loads present at the two differential TIA output bond pads 206C or in the TIA output signals themselves will result in a net signal being induced in the TIA ground. Such a TIA ground signal can be coupled back to the TIA input at bond pad 206A with high efficiency. Put another way, because the TIA input signal is interpreted relative to the TIA ground, any signal present on the TIA ground relative to the TIA input at the bond pad 206A will carry the same importance as if that signal were present directly on the TIA input. Thus, any feedback signal present on the TIA ground, if not compensated for, will interfere with intended signals received at the TIA input at the bond pad 206A. In order to cancel the effect of the TIA ground signal on the TIA input, it is desirable to couple the TIA ground signal back to the TIA input bond pad 206A itself in an efficient manner, in accordance with embodiments of the present invention.

The optical receiver assembly configuration shown in FIGS. 3 and 4 is configured to control such signal feedback via the use of a "bootstrapping" electrical path configuration, which results in the ground of the TIA 204 being electrically coupled to the ground of the PD 202, and ultimately to the TIA input 206A. This bootstrapping path is defined in FIG. 3 by the bond pads 206B of the TIA, which are coupled to the internal TIA ground, being electrically coupled with the top plate 254 of the isolator 250 via the bond wires 256. Note that the isolator bottom layer 252 prevents this TIA ground from electrically connecting with the reference surface 158. The isolator top plate 254, in turn, is electrically coupled to the capacitor 210, which is coupled to the PD 202, as has been described. Also as described, the power supply for supplying power to the PD 202 is delivered via the bond wires 214A, one of which connects with the top electrode 210A of the capacitor 210.

The above configuration establishes the electrical bootstrap path from the TIA ground to the PD ground that is independent of the package base reference surface 158. In another sense and as shown in FIG. 4, the TIA ground 204B is tied to the power supply $V_{pd}$ via the capacitor 210, again enabling a tie-in between the TIA ground 204B and the TIA input 204A via the PD 202. Note that, despite the above description the bootstrapping configuration can be realized via other components and connections that preserve the functionality of the configuration described herein.

The above bootstrapping configuration accounts for the above-described feedback and prevents it from compromising the integrity of the amplified electrical signal that is produced, amplified, and forwarded by the optical receiver assembly 200. In particular, any extraneous feedback signal that is undesirably acquired by the TIA ground as described above can be effectively transmitted, via the above bootstrapping configuration, to the bottom surface of the capacitor 210 that is affixed to the top plate 254 of the isolator 250. Because the capacitor 210 lacks significant impedance at the frequencies of interest, it allows the extraneous signal to pass through the capacitor and reach the PD 202. The extraneous signal can then be forwarded by the PD 202 to the TIA input bond pad 206A, together with the desired electrical signals typically produced by the PD during reception of optical signals. Thus, any extraneous feedback signal present at the TIA ground is also forwarded by the bootstrapping configuration such that it is also present at the TIA input. The presence of the extraneous feedback signal at both the TIA input and ground effectively cancels the signal out of the TIA input stream. This leaves only the desired signal to be amplified and forwarded by the TIA 204.

The above canceling effect is made possible by the bootstrapping configuration described above together with placement of the isolator 250, as the isolator prevents the PD 202 from electrically coupling with the reference surface 158 as a ground source. Rather, the PD 202 electrically couples with the TIA ground via the bootstrapping configuration, as already described. Also, the bootstrapping configuration, together with the isolator 250, advantageously reduces or eliminates the parasitic inductance 308 and capacitance 304 of the assembly as depicted in FIG. 4 by virtue of their mutual design. This in turn enables signals to travel unimpeded between the TIA ground at 206B to the TIA input at 206A via the capacitor 210 and PD 202. This desirably permits the extraneous feedback signal canceling effect described above to occur.

Figure 5:
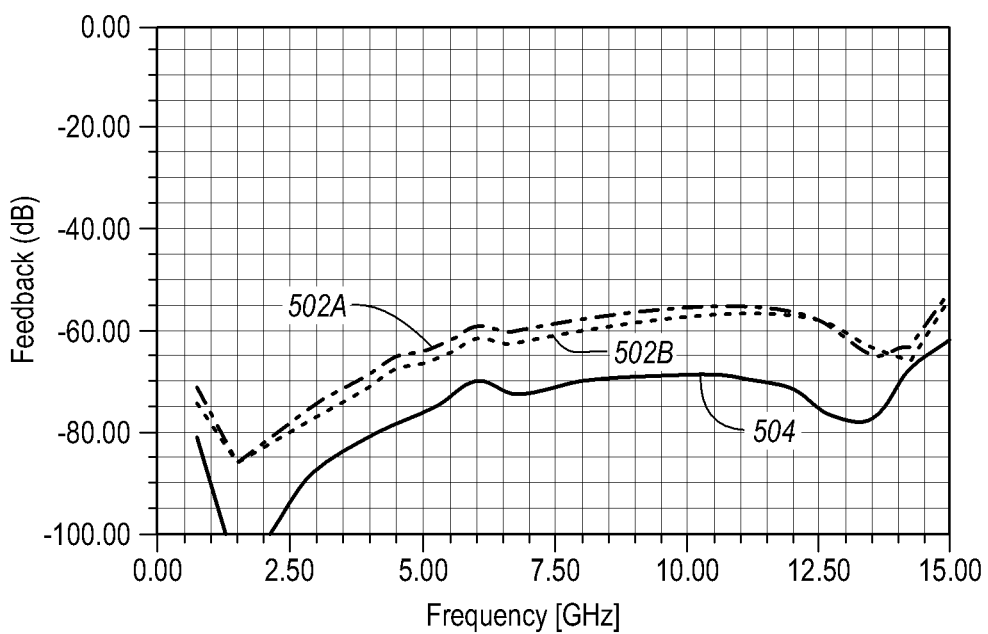
FIG. 5 is a graph plotting various parameters associated with operation of the optical receiver assembly configured in accordance with one embodiment of the present invention.

FIG. 5 is a graph that depicts modeled results that demonstrate the beneficial results of the above feedback canceling effect, wherein graphs 502A and 502B show the amount of signal output from the amplifier 204 that migrates back to the positive and negative input of the amplifier, respectively, and graph 504 is the combination of these two migrated signals as received and amplified by the amplifier. Graph 504 shows that the amount of amplified feedback, or gain, is desirably below the amount where feedback normally occurs.

The particular characteristics of the isolator 250 can be configured to provide the desired performance thereof. Thus, for example, the top surface areal size, dielectric constant, and thickness of the bottom layer 252 of the isolator 250 can be altered as needed to provide sufficient isolation for the top plate 254, given the fact that performance of the isolator is inversely proportional to its capacitance, which in turn is proportional both to the areal size of the top surface and its dielectric constant and inversely proportional to its thickness.

In accordance with the foregoing, the bootstrapping configuration discussed above discloses one exemplary means for electrically coupling a ground of an amplifier, such as the TIA 204, to an input of the amplifier, independent of a reference surface in view of controlling feedback in an optical receiver assembly. However, as noted these structures are simply one example of a means for such electrical coupling. Indeed, other structures and components could be implemented to accomplish the same functionality as that described herein. Thus, the above disclosure should not be considered limiting of the present invention in any way.

The present invention may be embodied in other specific forms without departing from its spirit or essential characteristics. The described embodiments are to be considered in all respects only as illustrative, not restrictive. The scope of the invention is, therefore, indicated by the appended claims rather than by the foregoing description. All changes that come within the meaning and range of equivalency of the claims are to be embraced within their scope.

What is claimed is:

1. An optical transceiver module, comprising:
   a housing;
   a printed circuit board at least partially included in the housing;
   a transmitter optical subassembly electrically coupled to the printed circuit board; and
   a receiver optical subassembly electrically coupled to the printed circuit board, the receiver optical subassembly including an optical receiver package, the optical receiver package including:
      a package base defining a grounded reference surface;
      a photodiode configured to receive and convert an optical signal into an electrical signal;
      a capacitor having a first electrode electrically coupled to a first electrode of the photodiode;
      a transimpedance amplifier configured to amplify the electrical signal produced by the photodiode, the transimpedance amplifier mounted on the grounded reference surface and being electrically coupled to the photodiode; and
      an isolator, comprising:
         a layer of dielectric material mounted on the grounded reference surface; and
         a metallic layer overlying the layer of dielectric material, the capacitor being affixed and electrically coupled to the metallic layer, and the metallic layer being electrically coupled to a ground of the transimpedance amplifier via a connector that is independent of the grounded reference surface.

2. The optical transceiver module as defined in claim 1, wherein the metallic layer of the isolator is electrically coupled to the ground of the transimpedance amplifier via at least one wire bond that extends from the metallic layer to a bond pad of the transimpedance amplifier.

3. The optical transceiver module as defined in claim 2, wherein first and second wire bonds extend in non-parallel directions between the metallic layer and bond pads of the transimpedance amplifier.

4. The optical transceiver module as defined in claim 1, wherein a power supply is supplied to the photodiode via the capacitor.

5. The optical transceiver module as defined in claim 4, wherein the ground of the transimpedance amplifier is electrically coupled to the power supply via the metallic layer and the capacitor.

6. An optoelectronic receiver package comprising:
   a package base defining a grounded reference surface;
   a photodiode mounted on a first capacitor, the photodiode configured to receive and convert an optical signal into an electrical signal, a first electrode of the first capacitor being electrically coupled to a first electrode of the photodiode;

a transimpedance amplifier configured to amplify the electrical signal produced by the photodiode, the transimpedance amplifier mounted on the grounded reference surface, the transimpedance amplifier including an input electrically coupled to a second electrode of the photodiode; and an isolator, comprising:
  a dielectric material that is affixed to a portion of the grounded reference surface; and
  a metallic layer atop the dielectric material, a second electrode of the first capacitor being affixed and electrically coupled to the metallic layer, and the metallic layer being electrically coupled to a ground of the transimpedance amplifier via at least one bond wire that is independent of the grounded reference surface.

7. The optoelectronic receiver package as defined in claim 6, wherein the isolator enables an electrical path to be established between the ground of the transimpedance amplifier and the input of the transimpedance amplifier via the metallic layer, the first capacitor, and the photodiode.

8. The optoelectronic receiver package as defined in claim 7, wherein the electrical path provides a conduit by which feedback signals present at the ground of the transimpedance amplifier are transmitted to the input of the transimpedance amplifier to cancel at least a portion of the feedback signal.

9. The optoelectronic receiver package as defined in claim 8, wherein the isolator and the transimpedance amplifier are electrically coupled via two bond wires that each extend between the metallic layer and a respective bond pad of the transimpedance amplifier, wherein the bond wires are configured to prevent mutual coupling.

10. The optoelectronic receiver package as defined in claim 9, wherein a power supply for the photodiode is provided by a lead of the package base and is supplied to the first electrode of the first capacitor, wherein a decoupling capacitor is interposed between the lead and the first capacitor.

11. The optoelectronic receiver package as defined in claim 6, wherein the package is included in an optical transceiver module.

12. The optoelectronic receiver package as defined in claim 11, wherein the optical transceiver module is configured to receive optical signals at a rate of at least 10 gigahertz (GHz).

13. An optical receiver package configured to compensate for a feedback signal, the optical receiver package comprising:
  a package ground;
  a detector including a signal output, the detector configured to convert an optical signal into an electrical signal;
  a capacitor;
  an isolator configured to electrically isolate the detector from the package ground, the isolator including a dielectric material mounted to the package ground and a top plate electrically coupled to the detector via the capacitor;
  an amplifier configured to amplify the signal output of the detector, the amplifier including an amplifier ground, the amplifier ground coupled to the package ground; and
  an electrical path configured to electrically couple the amplifier ground to the detector and the top plate independent of the package ground, the electrical path configured to transmit the feedback signal present on the amplifier ground to the detector such that the feedback signal is included with the electrical signal in the signal output of the detector.

14. The optical receiver package of claim 13, wherein the capacitor is configured to reduce the injection of noise into the signal output of the detector.

15. The optical receiver package of claim 13, wherein:
  the dielectric material is included in a dielectric layer,
  the top plate is included in a metallic layer overlying the dielectric layer, and
  the electrical path includes at least one wire bond that extends from the amplifier ground to the metallic layer.

16. The optical receiver package of claim 15, wherein the detector is electrically coupled to the metallic layer by way of the capacitor configured to reduce the injection of noise into the signal output of the detector.

17. The optical receiver package of claim 15, wherein first and second wire bonds extend in non-parallel directions between the amplifier ground and the metallic layer.

18. The optical receiver package of claim 13, wherein the detector includes an electrode electrically coupled to the electrical path and to a power supply of the optical receiver package.

19. The optical receiver package of claim 13, wherein the detector includes a photodiode.

20. An optical transceiver module including the optical receiver package of claim 13.

* * * * *